(12) United States Patent
Jaakkola et al.

(10) Patent No.: US 10,965,267 B2
(45) Date of Patent: Mar. 30, 2021

(54) MICROMECHANICAL RESONATOR AND METHOD FOR TRIMMING MICROMECHANICAL RESONATOR

(71) Applicant: TEKNOLOGIAN TUTKIMUSKESKUS VTT OY, Espoo (FI)

(72) Inventors: Antti Jaakkola, Espoo (FI); Tuomas Pensala, Espoo (FI); Aarne Oja, Espoo (FI); Panu Pekko, Espoo (FI); James R Dekker, Espoo (FI)

(73) Assignee: TEKNOLOGIAN TUTKIMUSKESKUS VTT OY, Espoo (FI)

(*) Notice: Subject to any disclaimer, the term of this patent is extended or adjusted under 35 U.S.C. 154(b) by 5 days.

(21) Appl. No.: 16/314,125

(22) PCT Filed: Jun. 29, 2017

(86) PCT No.: PCT/FI2017/050487
§ 371 (c)(1),
(2) Date: Dec. 28, 2018

(87) PCT Pub. No.: WO2018/002440
PCT Pub. Date: Jan. 4, 2018

(65) Prior Publication Data
US 2019/0173451 A1 Jun. 6, 2019

(30) Foreign Application Priority Data
Jul. 1, 2016 (FI) .................................. 20165556

(51) Int. Cl.
H03H 9/02 (2006.01)
H03H 3/007 (2006.01)
H03H 9/24 (2006.01)

(52) U.S. Cl.
CPC ...... *H03H 9/02448* (2013.01); *H03H 3/0076* (2013.01); *H03H 9/02393* (2013.01); *H03H 9/2447* (2013.01)

(58) Field of Classification Search
CPC .......... H03H 9/02448; H03H 9/02393; H03H 9/2447; H03H 3/0076
(Continued)

(56) References Cited

U.S. PATENT DOCUMENTS 4,658,173 A 4/1987 Nakamura et al.
5,144,184 A 9/1992 Greiff
(Continued)

FOREIGN PATENT DOCUMENTS

DE 10241425 3/2004
GB 2449669 12/2008
(Continued)

OTHER PUBLICATIONS

International Search Report for PCT/FI2017/050487 dated Nov. 6, 2017, 6 pages.
(Continued)

Primary Examiner — Michael Andrews
(74) Attorney, Agent, or Firm — Nixon & Vanderhye P.C.

(57) ABSTRACT

The present disclosure describes micromechanical resonator, a resonator element for the resonator, and a method for trimming the resonator. The resonator comprises a resonator element having a length, a width, and a thickness, where the length and the width define a plane of the resonator element. The resonator element comprises at least two regions (52, 53) in the plane of the resonator element, wherein the at least two regions have different thicknesses.

13 Claims, 6 Drawing Sheets

(58) Field of Classification Search
USPC .............................. 310/309, 311, 312, 323.06
See application file for complete search history.

(56) References Cited

U.S. PATENT DOCUMENTS

| | | |
|---|---|---|
| 2002/0074897 A1 | 6/2002 | Ma et al. |
| 2005/0195049 A1* | 9/2005 | Huang .................. H03H 9/2452 333/186 |
| 2007/0139140 A1 | 6/2007 | Rao et al. |
| 2011/0273061 A1* | 11/2011 | Thalmayr ............. H01L 41/253 310/346 |
| 2012/0248932 A1 | 10/2012 | Carpentier et al. |
| 2012/0286903 A1 | 11/2012 | Prunnila et al. |
| 2016/0322954 A1 | 11/2016 | Kaida et al. |

FOREIGN PATENT DOCUMENTS

| | | |
|---|---|---|
| JP | 2014-519260 | 8/2014 |
| WO | 2007/088696 | 8/2007 |
| WO | 2015/108124 | 1/2015 |
| WO | 2015/108125 | 7/2015 |

OTHER PUBLICATIONS

Written Opinion of the ISA for PCT/FI2017/050487 dated Oct. 27, 2017, 10 pages.
Search Report for FI20165556 dated Jan. 31, 2017, 2 pages.
Shahmohamimadi et al., "Turnover Temperature Point in Extensional-Mode Highly Doped Silicon Microresonators", IEEE Transactions on Electron Devices, vol. 60, No. 3, Mar. 1, 2013, pp. 1213-1220.
Office Action issued in JP Application No. 2018-568297 (dated Jan. 28, 2021) w/ partial translation, 10 pages.

* cited by examiner

US 10,965,267 B2

MICROMECHANICAL RESONATOR AND METHOD FOR TRIMMING MICROMECHANICAL RESONATOR

This application is the U.S. national phase of International Application No. PCT/FI2017/050487 filed Jun. 29, 2017 which designated the U.S. and claims priority to FI Patent Application No. 20165556 filed Jul. 1, 2016, the entire contents of each of which are hereby incorporated by reference.

FIELD OF THE INVENTION

The present invention relates to micromechanical resonators and oscillators and more particularly to controlling the frequency and temperature coefficient of the frequency of the resonators and oscillators.

BACKGROUND INFORMATION

Because of manufacturing non-idealities (e.g. variations in thicknesses of material layers and non-uniformity of patterning and etching processes), frequency and temperature coefficient of frequency (TCF) of a resonator may deviate from their target values. For high accuracy timing applications, these properties may have to be corrected in some manner, with accuracy depending on the application. However, it may be difficult to reach these goals economically.

Quartz resonators may be individually trimmed to the correct frequency by measuring the frequency, and by applying etching and/or by trimming of parts of gold electrode by a laser while monitoring the frequency. In silicon-based micromechanical resonators, the frequency and temperature behavior of the resonator may be recorded in memory, and a frequency synthesizer on an ASIC may be used for producing the desired oscillation frequency assuming that the non-accurate resonator frequency stays the same. However, a drawback of this approach is increased power consumption and degraded phase noise performance.

BRIEF DISCLOSURE

An object of the present invention is to provide a micromechanical resonator element and a method for trimming a resonator so as to alleviate the above disadvantages. The objects of the invention are achieved by a resonator and a method which are characterized by what is stated in the independent claims. The preferred embodiments of the invention are disclosed in the dependent claims.

The frequency and TCF of a resonator can be adjusted independently from each other by removing material from the top of the resonator in a patterned way, i.e. so that material is removed from different places on top of the resonator. The TCF may be adjusted by removing material from a central, optimally-sized region(s) at the resonator center. By optimizing the sizing, the TCF can be altered without affecting the resonator frequency. On the other hand, the resonator frequency may be adjusted by removing material in a peripheral region in the vicinity of the resonator edges, in which case the TCF may not be affected at all. Patterned material removal can be based on laser ablation or masked ion beam etching, for example.

The resonator element according to the present disclosure allows the resonance frequency and TCF to be adjusted independently from each other, e.g., with two successive trimming steps. This can significantly simplify the adjustment process. Further, the resonator element according to the present disclosure enables micromechanical resonators to be fabricated as fully passive components not requiring active PLL-based frequency synthesis. As a result, micromechanical resonators may be formed pin-to-pin compatible to quartz crystals.

BRIEF DESCRIPTION OF THE DRAWINGS

In the following the invention will be described in greater detail by means of preferred embodiments with reference to the attached drawings, in which

FIG. 2a shows an exemplary length-wise cross-section of a frequency-adjusting region in a length-extensional plate resonator according to the present disclosure;

FIG. 2b shows a simplified spring-mass analogy of the resonator element of FIG. 2a;

FIG. 7 shows an exemplary resonator configuration that uses a pattern that is complementary to the pattern shown in FIG. 5a;

DETAILED DISCLOSURE

Figure 1:
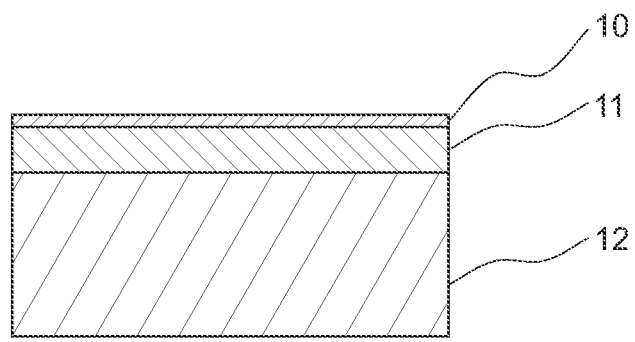
FIG. 1 shows an exemplary cross section of an in-plane extensional mode resonator stack.

The present disclosure describes a micromechanical resonator and a method for trimming such a resonator. The present disclosure further describes a resonator element for a micromechanical resonator.

A micromechanical resonator according to the present disclosure comprises a support structure and a resonator element suspended to the support structure. The resonator element has a length, a width, and a thickness (i.e. height). Each of these dimensions may be defined to be perpendicular to each other. The length and the width may be considered to define a plane of the resonator. The plane of the resonator is typically co-planar with a wafer the resonator device is manufactured to. The thickness may extend perpendicular to the plane of the resonator. When the length and width are not equal, length may represent the longer dimension. The length and width may be in the range of hundreds of micrometres (μm), for example. The thickness may be in the range of few (>3) micrometres to tens of micrometres, for example.

The resonator element may be in the form of a beam or a plate, for example. The term "beam" may be considered to refer to resonator elements whose in-plane aspect ratio (length to width) is at least 5. Typically, the aspect ratio is at least 10. The term "aspect ratio" means the largest obtainable ratio of a first in-plane dimension of the resonator (i.e. a first dimension extending in the plane of the resonator) to a second in-plane dimension of the resonator perpendicular to the first in-plane dimension. Alternatively, the resonator element may be a plate that extends in the directions of the main axes of the resonator element in the plane of the resonator. In the context of the present disclosure, the "main axis" of an element means an axis of elongation and/or symmetry of an element. For example, main axes of a rectangle or square are oriented in the plane of the resonator and coincide with its symmetry axis. The main axis of a beam is along the elongated direction of the beam. Main axes of the resonator element may be aligned with a [100] crystal direction of the wafer the resonator device is manufactured to, or may deviate from the [100] crystal direction by less than 25 degrees.

The plate may have a rectangular shape in the plane of the resonator. For example, it may be a square plate. The plate can also be a polygonal, circular or elliptical. The aspect ratio of a such a plate (length to width) is less than 5. The plate may have a top surface (i.e. "top") and a bottom surface (i.e. "bottom") that extend parallel to the plane of the resonator.

The resonator may be suspended to a support structure by at least one anchor. In the context of the present disclosure, "suspending" a resonator means anchoring the resonator in such a way that at least part of it is able to move with respect to the support structure in the desired resonance mode. Suspending can take place by joining a part of the resonator directly to the support structure or through one or more anchor elements, which are typically narrow bridges between the support structure and the resonator. The suspending of the resonators can be carried out at any suitable location allowing a desired resonance mode to emerge into the resonator element.

The resonator element may be configured to resonate (dominantly) in an extensional mode, a flexural mode or a torsional mode, for example. In a plate resonator element, the resonance mode may be a square extensional (SE) mode, a length extensional mode (LE), a width extensional (WE) mode, or flexural mode, for example. In a beam resonator element, the resonator mode may be an extensional mode, a flexural mode, or a torsional mode, for example.

The resonator element may be monolithic (i.e. made of single material). The resonator element may be made from semiconductor material, for example. The semiconductor material may be silicon, for example. The resonator may be electrostatic resonator (resonator made of only silicon), for example. The semiconductor material may be non-doped, homogenously doped, or it may comprise layers with different doping.

Alternatively, instead of being a monolithic structure, the resonator element may be a compound structure. For example, the resonator element may comprise a base beam or plate onto which one or more additional layers of one or more different materials have been added (e.g. by plating or growing). The resonator may be a piezoelectrically actuated resonator where the additional layers act as piezoactive excitation means, for example. The resonator element may comprise an aluminium nitride (AlN) layer, and a molybdenum (Mo) layer added on top of a silicon base layer, for example. The aluminium nitride (AlN) layer may act as a piezoelectric layer, and the molybdenum (Mo) layer may act as an electrode layer.

Because of the manufacturing non-idealities, the frequency and the TCF of a resonator may deviate from their target values. A typical variation of frequency (standard deviation) may be 500-1000 ppm (parts per million) from its desired value, and a typical variation of the TCF can be +−0.5 ppm/° C. from its desired value. For high accuracy timing applications, these properties may have to be corrected in some manner, with accuracy depending on the application. For example, in some applications a desirable frequency deviation may be within +/−100 or, preferably, +/−20 ppm, and a desirable TCF deviation may be at least within 0.1 ppm/° C.

In the context of the present disclosure, the temperature coefficient refers to the linear TCF, i.e. the first order derivative of the frequency-vs-temperature characteristic curve, defined at a certain temperature (25 C, for example). The quadratic TCF (i.e. the second order TCF), is the second order derivative of the frequency-vs-temperature characteristic curve, defined at a certain temperature (25 C, for example). The linear and quadratic TCF term may be defined at a certain temperature, typically the room temperature (25° C.). Effects from the quadratic temperature coefficient may be considered negligible in comparison with the effect from the linear TCF, and are not further discussed in the present disclosure. Ideally, the linear TCF is zeroed. The term "zeroing" of linear TCF in the present context means reduction of an absolute value of the linear TCF below a predefined level.

One approach for trimming the resonator frequency and its TCF is using non-patterned trimming (i.e., homogenous removal of material from top of the resonator. However, in this approach, a change in the frequency is coupled to a change in the TCF. FIG. 1 shows a cross section of an exemplary in-plane extensional mode resonator stack. The stack comprises three layers: a silicon (Si) base layer 10, aluminium nitride (AlN) layer 11, and a molybdenum (Mo) layer 12. Thicknesses of Si, AlN, and Mo layer are 15/0.8/0.3 μm, respectively. In FIG. 1, a removal of up to 100 nm of top molybdenum does not degrade the electrical performance of the resonator (30% of the initial thickness). By using a parallel spring-mass approximation for the resonator, the following mass-weighted averages for the frequency f and for the TCF as a function of the individual layer properties, $f_i$, $TCF_i$ and $m_i$ can be used:

$$f^2 = \Sigma_i p_i f_i^2,$$

$$TCF = \Sigma_i p_i TCF_i,$$

$$p_i = m_i / \Sigma_i m_i. \quad (1)$$

It may be desirable to be able to correct a deviation of the resonator frequency in the range of +/−3000 ppm, for example. A similar deviation range for the TCF may be on the order of +/−0.5 ppm/° C. Table 1 below shows exemplary effects caused by removal of material from the molybdenum (Mo) layer in FIG. 1. In table 1, a change df in frequency and a change dTCF in the TCF are shown as a function of the removed molybdenum.

TABLE 1

| Removed molybdenum [nm] | 1 | 10 | 100 |
|---|---|---|---|
| df [ppm] | 69.44 | 694.4 | 6944 |
| dTCF [ppm/° C.] | 0.0076 | 0.076 | 0.76 |

In table 1, with a maximum 100 nm of top molybdenum removal, the desired levels of change in frequency or in TCF can be achieved. However, the coupling between the frequency change and the TCF change is clear. For example, if a frequency shift of approximately 3000 ppm is desired, approximately 50 nm of molybdenum has to be removed. This, however, leads to 0.4 ppm/° C. change in the TCF.

In order to decouple the frequency change from the TCF change, a patterned trimming method according to the present disclosure may be used. The method according to the present disclosure may implement a patterned trimming by forming of at least two regions to the resonator element in the plane of the resonator. The at least two regions may have different thicknesses. The thicknesses may be selected in response to a deviation of a resonator frequency with respect to a target value and/or a deviation of a linear temperature coefficient of the resonator frequency with respect to a target value.

The at least two regions may be in the form of one or more central regions and one or more peripheral regions, for example. The central region/regions may be considered to be closer to the center of mass (which may coincide with a lengthwise and a widthwise axis of symmetry) of the resonator element than the peripheral region/regions. The central region may be centered to the center of mass of the resonator element. In the plane of the resonator, the central region may have a rectangular shape. Alternatively, the central region or regions may have a different symmetrical form.

In contrast, the peripheral region or regions may be considered to be positioned in the vicinity of the resonator edges, further away from the center of mass of the beam structure than the central region. A resonator element according to the present disclosure may comprise a plurality of peripheral regions. For example, two peripheral regions may be positioned on two opposite sides of the central region. Alternatively, a peripheral region may form a uniform, loop-shaped region around the central region. The peripheral region or regions may be symmetrical with respect to a lengthwise axis of symmetry and a widthwise axis of symmetry of the resonator element.

In a first aspect of the resonator and the method according the present disclosure, a resonator may be trimmed with a patterned frequency adjustment trim that comprises forming a frequency-adjusting region within the at least one peripheral region of the resonator element. FIG. 2a shows an exemplary length-wise cross-section of a frequency-adjusting region in a length-extensional plate resonator according to the present disclosure. In FIG. 2a, a resonator element similar to the structure of FIG. 1 is shown. However, material near the edges of the structure has been removed, thereby forming distinct frequency-adjusting regions 20.

FIG. 2b shows a simplified spring-mass analogy of the resonator element of FIG. 2a. In FIG. 2b, two springs 21 are connected in series. Two masses 22 are connected to the free ends of the springs 21. According to the analogy, the center region of the plate resonator element stretches but does not move significantly whereas the peripheral regions of the plate resonator move but do not stretch significantly. The material at the edge of the resonator acts mostly as a mass element and its contribution to the spring may be considered negligible.

The temperature dependence may be considered to come from the spring portion. Therefore, the frequency of a resonator may be adjusted independently of the TCF, if the thickness of the plate resonator is adjusted only at from a region near the perimeter of the resonator. A surface area of the frequency-adjusting region may be selected such that said surface area is sufficiently large for reaching any deviation of the resonator frequency within a set deviation range by adjusting a thickness of the frequency-adjusting region, and the thickness of the frequency-adjusting region may be adjusted in response to the deviation of the resonator frequency.

Figure 2:
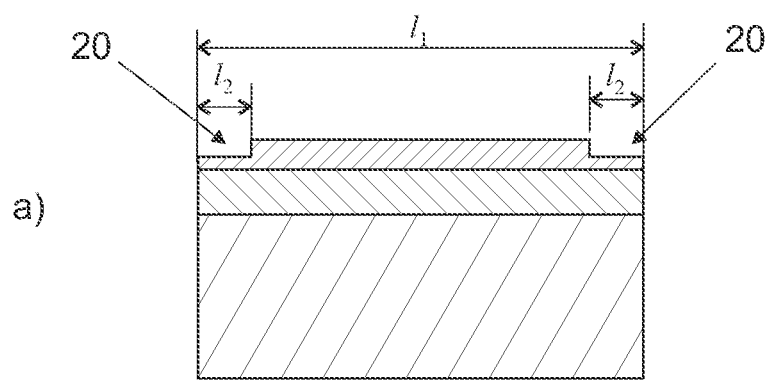
Figure 2:
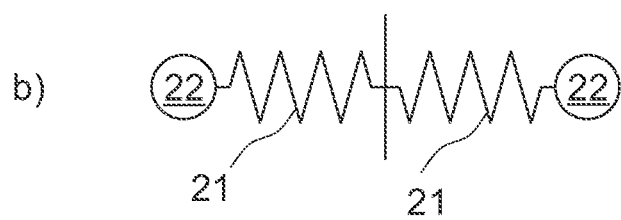

At the same time, the surface area may be selected to be sufficiently small so that the frequency-adjusting region has only a negligible effect on the linear TCF of the resonator element. A surface area of the frequency-adjusting region may 20% or less (preferably 10% or less) of the total surface area of a cross section of the resonator in the plane of the resonator, for example. In FIG. 2, the sum of lengths $l_2$ of the frequency adjusting regions 20 may be 10% of the total length $l_1$ of the plate resonator. Table 2 shows exemplary values of the change df in the resonator frequency of FIG. 2 as a function of the removed molybdenum. Table 2 shows that with 100 nm of material removal, approx. 3000 ppm change can be realized (with only negligible effect on the TCF).

TABLE 2

| Removed molybdenum [nm] | 1 | 10 | 100 | 300 |
|---|---|---|---|---|
| df [ppm] | 26 | 264 | 2640 | 7920 |

In a second aspect of the resonator and method according to the present disclosure, the thicknesses of the central region/regions and the peripheral region/regions may be selected in response a deviation of a temperature coefficient of the resonator frequency with respect to a target value.

The resonator element of the resonator may comprise a base layer structure comprising a first layer. The resonator element may further comprise a second layer on top of the base layer structure. The materials of the first layer and the second layer on top of the first layer may be selected such that linear temperature coefficients of the first layer and the second layer have opposite signs. Alternatively, a first layer and a second layer with opposite-signed linear TCF values may be formed into a monolithic resonator structure. The linear TCF value may change sharply between the first layer and the second or the TCF value may change may be gradually. In this context, the term "linear TCF value" (i.e. "linear temperature coefficient") of a layer (or a region) of a resonator element refers to a linear TCF of the resonator element would have if it was completely made of a material of said layer. In other words, "linear TCF value" refers to a linear TCF of a similarly dimensioned resonator element that resonates in a similar resonance mode, but is made of only the material of said layer. In the present disclosure, the terms "linear TCF value" and "linear temperature coefficient" may be used interchangeably.

When a resonator element has a first layer and a second layer that have opposite-signed linear TCF values, the TCF values of the two layers compensate each other. The first layer may be made of silicon or other semiconductor material, for example. Its linear TCF may be around +10 ppm/° C., for example. The second layer may be an electrode layer made of metal, such as molybdenum. The linear TCF of a molybdenum layer may be around −30 ppm/° C., for example. However, the first and second layer may be made of other materials. For example, the first and second layer may both be same or different semiconductor materials with possibly different doping.

The second layer may comprise at least two regions in the plane of the resonator element. The at least two regions may have different thicknesses. The at least two regions may be formed by changing thickness of at least one portion of the least one second layer, for example.

A difference between the thicknesses of the at least two regions may be adjusted in response to a deviation of the linear temperature coefficient from a desired value, such as zero. The TCF adjustment can be achieved without affecting the resonator frequency. Shapes and positions of the at least two regions may be selected such that an effect of the difference between the thickness of the at least two regions on the resonator frequency is minimized.

Figure 3:
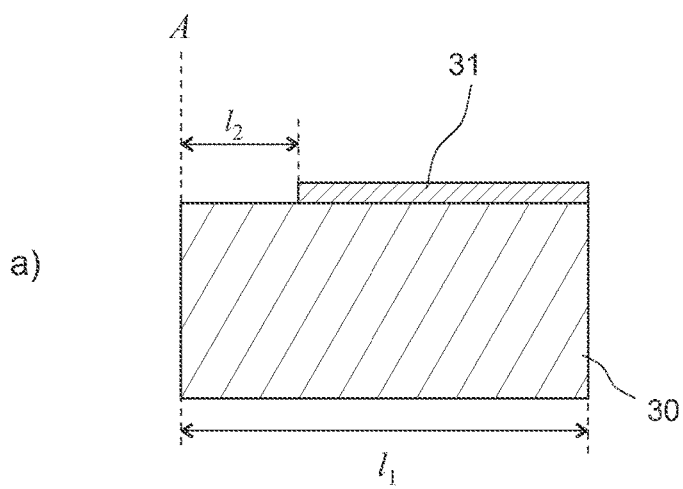
FIGS. 3a to 3d illustrate exemplary effects a ratio between surface areas of the at least two regions on the resonator frequency.
Figure 3:
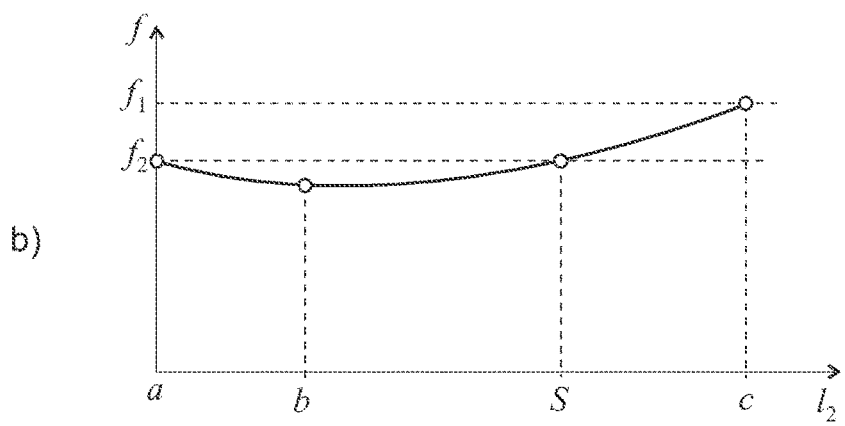
Figure 3:
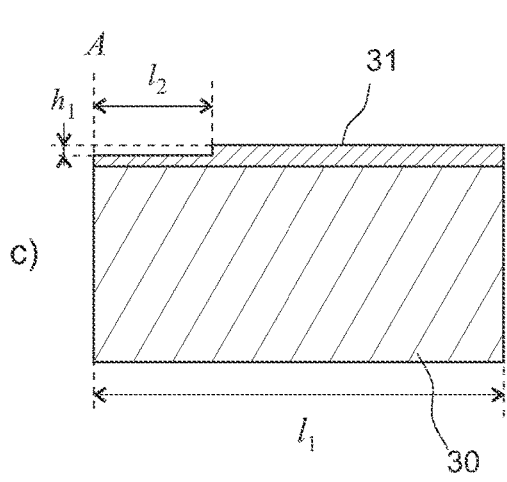
Figure 3:
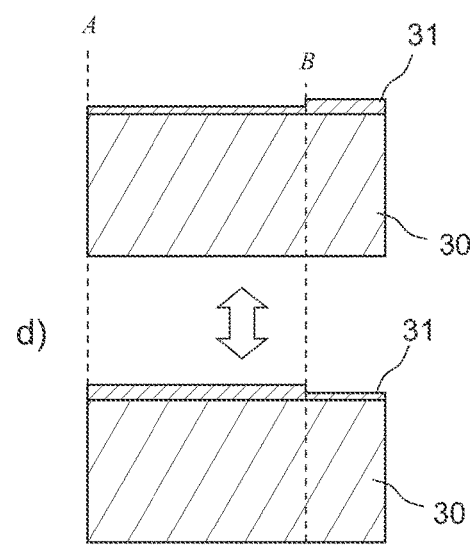

FIGS. 3a to 3d illustrate exemplary embodiments of the second aspect of the method according to the present disclosure. FIG. 3a shows an exemplary cross section of a resonator element according to the present disclosure. The resonator element is symmetrical with respect to a symmetry axis A so only a half of the cross section is shown. FIG. 3a shows a base layer structure 30 comprising a first layer made of semiconductor material, and a second layer 31 on top of the base layer structure 30. A first dimension $l_1$ in FIG. 3a shows the (half of) beam length of the resonator and a second dimension $l_2$ shows a portion of the second layer 31 that is removed, i.e. the hole size. The resonator in FIG. 3a may be an LE mode resonator with a 15-um-thick silicon beam as the base layer structure 30 and a 0.3 um thick molybdenum layer as the second layer 31, for example. Alternatively, the base layer structure 30 may be a stack of Si+AlN (or any other more complex compound resonator).

FIG. 3b illustrates how the resonator frequency changes as a function of the changed surface area (or length $l_2$) of the resonator of FIG. 3a. The illustration is based on a numerical finite element simulation. Initially in FIG. 3b, no second layer 31 is present. The resonator resonates at an initial, first frequency $f_1$. When the second layer 31 is added, the resonator resonates at a new, second frequency $f_2$ that lower than the initial frequency $f_1$. This is visualized by point a in FIG. 3b. When material is removed from the center of the resonator (i.e. $l_2$ starts to increase from zero), the frequency is further decreased as the remaining portion of the second layer 31 acts then more as a mass. This is visualized by point b in FIG. 3b. However, if more material is removed from the second layer 31 (i.e. $l_2$ increases further), the frequency of the resonator starts to rise, since less mass loading is present. Ultimately, when the whole second layer has been removed, the frequency returns back to the initial frequency $f_1$. This is visualized by point c in FIG. 3b. Therefore, at a certain value between points b and c, the hole size has a value at which the resonator resonates at the second frequency $f_2$. This is visualized by point S in FIG. 3b. In the resonator of FIG. 3a, the optimal hole size $l_2$=S was 75% of the beam length.

In FIG. 3a, the total thickness of the second layer 31 removed from the hole area $l_2$. However, because of symmetry reasons, a partial removal (such as 100 nm out of the total thickness of 300 nm) of the second layer works in a similar manner. FIG. 3c shows an exemplary cross section of a resonator element where only a portion of the thickness of the second layer 31 is removed. In FIG. 3c, a hole of thickness $h_1$ has been formed to the second layer 31. In the length-wise direction, the hole has a size $l_2$ that maintains the frequency of the resonator in a similar manner as shown in FIGS. 3a and 3b. In a simulation, assuming the hole size $l_2$ would be the optimal 75% of the beam length, a change of 0.6 ppm/C° was calculated for a 100 nm removal of the second layer 31. This provides a sufficient capacity for adjusting the TCF. This result was compared with a similar case where all of the second layer was removed (hole size $l_2$ being 100% of beam length $l_1$). TCF change was increased by less than 5%.

Because of symmetry reasons, it is also possible to form complementary patterns in order to modify the TCF while maintaining the resonator frequency constant. For example, it is possible to form patterns that are complementary to the configurations of FIGS. 3a and 3c, and which have an effect on the TCF only and while maintaining the resonator frequency. In this context, two TCF-modifying patterns are complementary when they have the same boundaries between their central and peripheral region. However, the relation between the thicknesses of the central and peripheral region is reversed. In other words, if a pattern has a thickness of the central region that is greater than the thickness of a peripheral region, a thickness of a corresponding central region in a complementary pattern is smaller than the thickness of the corresponding peripheral region in the complementary pattern. FIG. 3d shows two complementary patterns. Both patterns define a central region and a peripheral region that are defined by a boundary B. However, in the upper pattern of FIG. 4d, the central region has a lower thickness whereas, in the lower pattern of FIG. 4d, the peripheral region is thinner.

Figure 4:
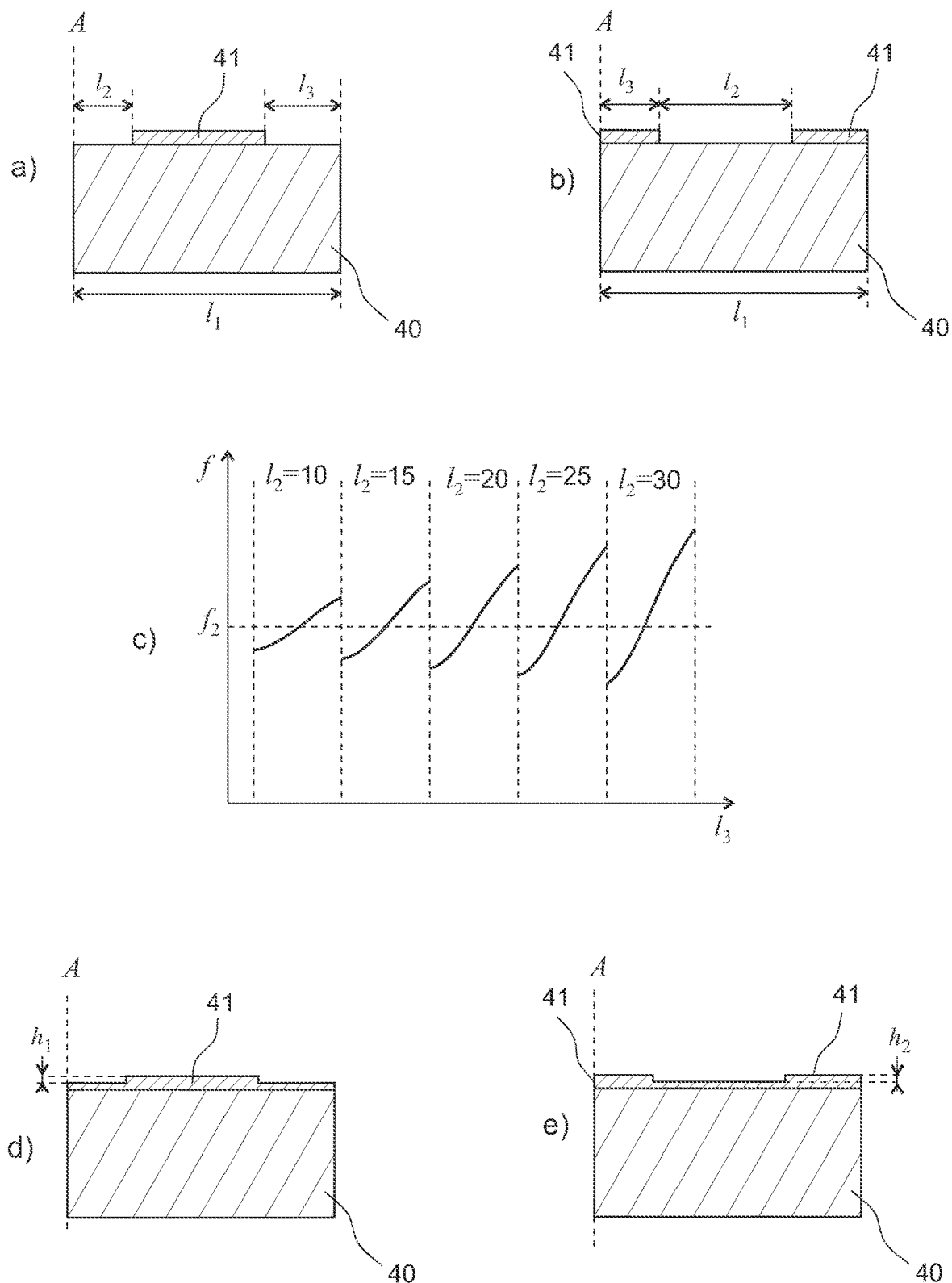
FIGS. 4a to 4e illustrate another approach for selecting shapes and positions of the regions with different thicknesses in a resonator element.

FIGS. 4a to 4e illustrate a slightly different approach for selecting the shapes and positions of at least two TCF-modifying regions. The shapes and position may be selected such that the effect of the difference between the thickness of the at least two regions on the resonator frequency is minimized. FIG. 4a shows an exemplary cross section similar to FIG. 3a. The basic structure and layer materials may be the same as in FIGS. 3a and 3b, for example. FIG. 4a shows a first, base layer structure 40, and a second layer 41 on top of the base layer structure 40. Similar to FIGS. 3a to 3d, when the second layer 31 is uniform, the resonator resonates at a new, second frequency $f_2$.

However, in contrast to FIG. 3a, portions of the second layer 41 may be removed in both a central region and a peripheral region of the resonator element in FIG. 4a. A first dimension $l_1$ in FIG. 4a shows the (half of) beam length of the resonator. A second dimension $l_2$ shows a first portion of the second layer 41 that is removed from the central region. A third dimension $l_3$ shows a second portion of the second layer 41 that is removed from the peripheral region.

If the third dimension $l_3$ would be zero, the configuration of FIG. 4a would correspond with the configuration of FIG. 3a. Thus, as discussed in relation to FIG. 3b, it would be possible to find a value for the second dimension $l_2$ that would produce a resonator frequency below the initial frequency $f_1$. On the other hand, if the third dimension $l_3$ starts to increase from zero (while maintaining $l_2$ constant), the frequency of the resonator starts to approach the first frequency $f_1$ at some point as the remaining portion of the second layer 41 becomes smaller and smaller. Ultimately, if the whole second layer 41 is removed, the resulting resonator frequency is the first frequency $f_1$. As a result, it is possible to find a configuration, where the second dimension $l_2$ and the third dimension $l_3$ are both non-zero while the resulting resonator frequency corresponds with the second frequency $f_2$.

Similar to FIG. 3d, it is also possible to find use a complementary pattern for the configuration of FIG. 4a. FIG. 4b shows an exemplary cross section of such a complementary pattern of a resonator element according to the present disclosure. The second layer 41 is in two portions in FIG. 4b. A first dimension $l_1$ in FIG. 4b shows the (half of) beam length of the resonator. A second dimension $l_2$ shows a portion of the second layer 31 that is removed, i.e. the hole size. A third dimension $l_3$ shows the distance of the hole from the symmetry axis A in the plane of the cross section, i.e. the hole distance. FIG. 4c illustrates a simplified diagram, based on numerical finite element simulation, of the effects of altering the second dimension (i.e. the hole size) and the third dimension $l_3$ (i.e. the hole distance) of FIG. 4b. FIG. 4c shows curves for five different hole sizes ($l_2$=10, 15, 20, 25, and 30 μm) as a function of the third dimension $l_3$ (it should be noted that an arbitrary offset on the $l_3$ has been added to the different curves to show them clearly on the same plot). FIG. 4c shows that it is possible to find a plurality of configurations (with different hole sizes and hole distances) at which the resulting resonator frequency is the second frequency $f_2$.

Further, although FIGS. 4a and 4b show removal of the second layer 41 for its full thickness, it is possible to remove only part of the thickness of the second layer similar to FIGS. 3c and 3d. FIGS. 4d and 4e show examples of partial removal of the second layer 41. FIG. 4d corresponds FIG. 4a, and FIG. 4e corresponds FIG. 4b. FIG. 4d shows that only portion $h_1$ and $h_2$ of the total thickness of the second layer 41 has been removed. The portions $h_1$ and $h_2$ may be the same or they may differ from each other. FIG. 4e shows that only a portion $h_1$ of the total thickness of the second layer 41 has been removed.

Based on the above-described principles, it is possible to control the TCF and the frequency of a micromechanical resonator independently from each other. A trimming process may comprise trimming only the TCF or only the frequency. Alternatively, both the TCF and frequency may be trimmed. In the following paragraphs, some embodiments of a micromechanical resonator according to the present disclosure are discussed in more detail.

Figure 5:
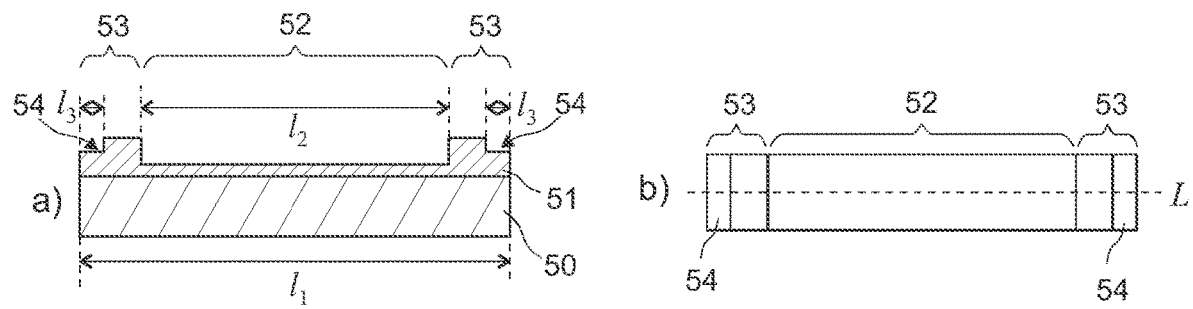
FIGS. 5a and 5b illustrate an exemplary LE mode beam resonator according to the present disclosure.

FIGS. 5a and 5b illustrate an exemplary LE mode beam resonator according to the present disclosure. In FIG. 5a, a cross section of the beam resonator is shown. FIG. 5b shows a top view of the beam resonator. The beam extends along a length axis L (shown in FIG. 5b) and comprises a central region 52 and peripheral regions 53 on opposite ends of the beam. The length of the beam is $l_1$ in FIG. 5a. The central region 52 forms a hole that extends to a part of the thickness of the second layer 51. The hole size is $l_2$. Based on the above-described principles, it is possible to find a ratio between the central region 52 and peripheral regions 53 at which changes to the thickness of the central region 52 (or, alternatively, changes to the peripheral regions 53) alter the linear TCF of the beam but have only a negligible (or non-existent) effect on its frequency.

FIGS. 5a and 5b show that the peripheral regions further comprise frequency-adjusting regions 54. The frequency-adjusting regions 54 are the outmost regions positioned at the ends of the beam. The surface areas of the frequency-adjusting regions 54 are selected such that said surface areas are sufficiently large for reaching any deviation of the resonator frequency within a desired deviation range by adjusting a thickness of the frequency-adjusting region. At the same time, however, the frequency-adjusting regions 54 are small enough so that a change of thickness in the frequency-adjusting regions 54 has only a negligible effect on the TCF (if detectable at all).

Figure 6:
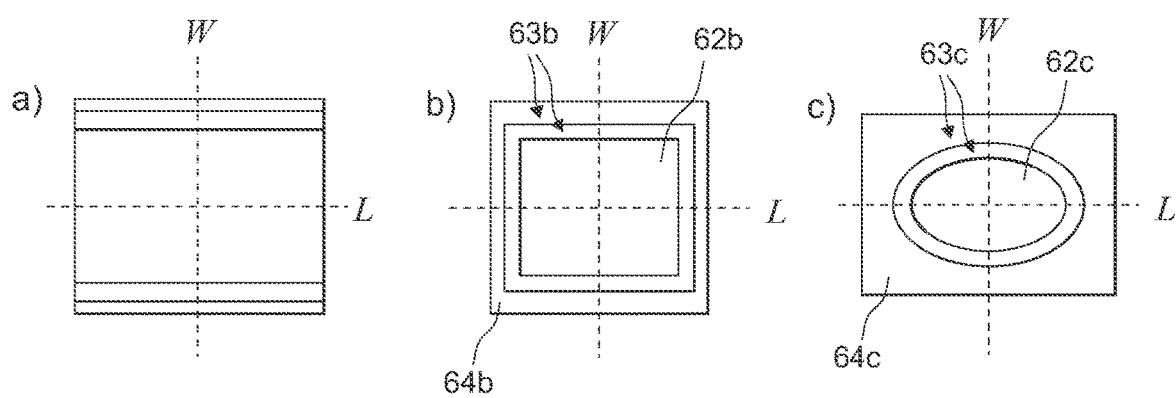
FIGS. 6a to 6c show exemplary plate resonators according to the present disclosure.

FIGS. 5a and 5b illustrate a LE mode beam resonator that may be considered to have one-dimensional characteristics. However, the above-described principles are also applicable to micromechanical resonators with two-dimensional characteristics. The resonator may be a plate resonator configured to operate in LE, SE or WE mode, for example. FIGS. 6a to 6c show some exemplary plate resonators according to the present disclosure.

FIG. 6a shows an exemplary WE mode plate resonator. A cross section of the plate resonator of FIG. 62 along its width axis W may be similar to the cross section shown in FIG. 5a, for example.

FIG. 6b shows an exemplary SE mode plate resonator. The resonator has a rectangular central region 62b, and a peripheral region 63b that forms a rectangular loop around the central region. The peripheral region 63b comprises a frequency-adjusting region 64b. A cross section of the plate resonator of FIG. 6b along its width axis W and/or its length axis may be similar to the cross section shown in FIG. 5a, for example.

FIG. 6b shows an exemplary SE mode plate resonator. The resonator has an oval-shaped central region 62c, and a peripheral region 63c that forms a loop around the central region. The peripheral region 63c comprises a frequency-adjusting region 64c. A cross section of the plate resonator of FIG. 6c along its width axis W and/or its length axis may be similar to the cross section shown in FIG. 5a, for example.

Figure 7:
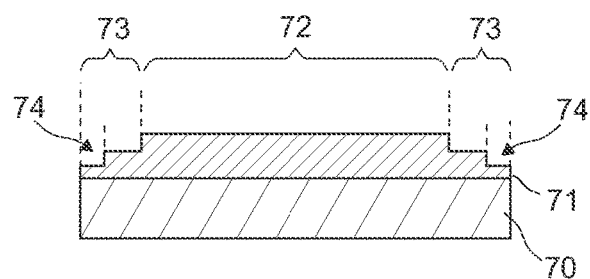

Regarding complementary patterns for a TCF trim, an exemplary embodiment of resonator configuration utilizing a complementary pattern is discussed next. FIG. 7 shows an exemplary resonator configuration that uses a pattern that is complementary to the pattern shown in FIG. 5a. In FIG. 7, the resonator element comprises a first, base layer structure 71 and a second layer 72 formed on top of the base layer structure 71. A pattern according to the present disclosure has been formed by locally modifying the thickness of the second layer 72 of the resonator element. The resonator element comprises a central region 72 and peripheral regions 73. In contrast to FIG. 5a, the central region 72 is thicker than the peripheral regions 73.

At a first sight, using a pattern that is complementary to the pattern shown of FIG. 5a may not appear beneficial. A change in the ratio between the sizes of the central region 72 and the peripheral region(s) 73 has a smaller effect to the TCF than when using the non-complemented pattern of FIG. 5a because the region with most spring contribution (central region) would not be affected at all. However, for some material combinations (e.g. a harder second layer material that is trimmed), the optimal hole size may be considerably smaller, and thus the complemented profile may be a better way for modifying TCF.

Although the above examples mostly discuss extensional modes (LE, WE, SE), a resonator according to the present disclosure may also be configured to resonate in other mode/modes than extensional modes. For example, flexural and torsional modes have similar optimal top layer trimming geometry, where TCF adjustment can be decoupled from frequency adjustment. Same concerns also higher-order (overtone) modes. Further, although the above examples discuss mostly adjusting the linear TCF and the frequency through controlling the thickness of different regions in the resonator element, the frequency (and also the TCF) may be adjusted by controlling the sizes of the regions. For example, the resonance frequency of a resonator element may be adjusted by changing the area of the frequency-adjusting region (while at the same time maintaining the thickness of the frequency-adjusting region constant).

A micromechanical resonator element according to the present disclosure may be manufactured in various ways. A method according to the present disclosure may comprise adding a second layer of material on top of a surface of a base layer structure of the resonator element, and removing matter from the additional layer in order to form the at least two regions of the resonator element. For example, laser ablation may be used for the trimming process. In laser ablation, small amounts of material can be removed in a patterned way. Typical lateral dimensions of a resonator may be 200×200 um, while a spot of a laser may be around 1 um in diameter, and thus "painting" of different patterns on the resonator is feasible.

A laser-ablation-based trimming according to the present disclosure may comprise two stages, for example. In the first stage, an initial frequency of the resonator may first be measured at a first temperature. The first temperature may be the room temperature (25° C.), for example. The temperature of the resonator may then be raised to a second temperature. The second temperature may be the maximum temperature (+85° C.) in the industrial range (−40 . . . +85° C.), for example. In order to trim the linear TCF of the resonator, laser pulses may be fired in order to evaporate a portion of the thickness of the resonator element in a specific region of the element. At the same time, the current frequency of the resonator may be monitored. Once a difference between the initial frequency and the current frequency is within a predefined allowable deviation range, the first stage is finished, and the second stage is initiated.

In the second stage, a frequency-correction trim is performed. A frequency-adjusting region may be formed in a peripheral region of the resonator element by laser pulses. A hollow laser beam may be used for modifying the thickness of the peripheral region, for example. At the same time, the frequency of the resonator may be monitored. Once the frequency is within a predefined allowable deviation range, the second stage is finished.

As described earlier in the present disclosure, the shapes and positions of the central and peripheral regions can be selected such that TCF is essentially decoupled from frequency. Thus, the above two-stage trimming method may be performed as a single-pass procedure. However, it is not necessary that there are two separate trimming steps that are decoupled from each other to get both the frequency and the TCF to their desired values right. A non-patterned trim may be used for adjusting the TCF to its desired value (while also modifying the resonator frequency). A patterned frequency adjustment trim according to the present disclosure may then performed without affecting TCF in order to adjust the frequency to its target value. However, if the first of the step (trimming the TCF) is decoupled from frequency adjustment, the required frequency adjustment in the second step may be much lower. Also, it is possible to perform one or more iterations of first stage and/or the second, if the TCF and the frequency adjustments are not decoupled from each other.

Similar outcome as with laser ablation may be reached with ion beam trimming. A two-stage approach similar to that described above may be used. Patterned trimming could be realized with masks that could be removed after trimming step. Achieving a patterned trim result (with ion beam trimmer) may be based on patterning of the top material at an earlier process step with a standard resist, if there is very good selectivity difference favouring the material to be removed.

A dry resist may be used for patterning of released devices. This may be useful if, for example, two successive ion beam trimming steps have to be realized.

A sacrificial hard mask can be used for patterned trimming. The mask may be oxide, for example, which may be removed with HF (Hydrogen Fluoride) vapour after the trimming step. The effect of the sacrificial mask on the TCF and frequency may have to be accurately modelled so that the resonator properties reach their target values after the mask removal. ALD (Atomic Layer Deposition)-based, very homogeneous coatings may be used for meeting this requirement.

Combination of multiple top electrode materials with different selectivities during ion beam trimming may be used for realizing patterned trimming with reduced need for masks. Ambient gas, which affects trimming selectivities, may be changed for successive trimming steps, and this may help realizing patterned trimming.

Reactive ion beam trimming, i.e., trimming using a reactive gas such as fluorine or oxygen, may be used for trimming. Such gases can trim the metal electrode with very high selectivity over the mask layer. This allows the use of very thin mask layers. The mask layers may be ALD or PECVD (Plasma-Enhanced Chemical Vapor Deposition) layers, for example. When the mask is sufficiently thin (a few nm) it can even remain in place.

With ion beam trimming, the trimming process may be faster (per component) than with laser ablation. Resonator devices on a wafer may not be individually trimmable, and in-situ measurement of the resonance frequency may be challenging. However, the devices may be assumed to have a spatial correlation. In other words, properties of the devices may be assumed to correlate the properties of nearby devices on the wafer. Thus, trimming each device individually may not be necessary.

Although the above embodiments discuss the use of laser ablation or ion beam trimming for implementing a resonator element according to the present disclosure, other methods may also be used. Any way of controlled removal of material can potentially be utilized.

Figure 8:
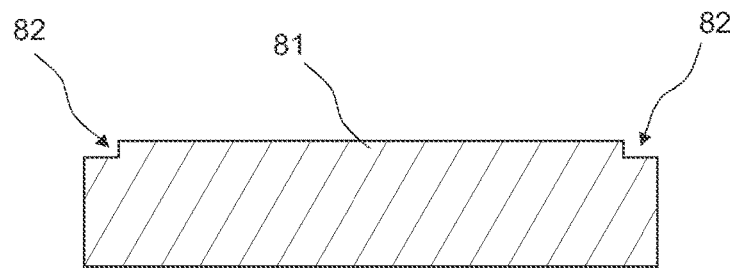
FIG. 8 shows an exemplary cross section of a resonator element comprising only the base layer.

In some embodiments, a TCF trim may not be required (or may not be possible), and only resonator frequency needs to be corrected as the last fabrication step. For example, the resonator may be electrostatic resonator (resonator made of only silicon). In such a case, a frequency-adjustment region in the peripheral region of the resonator element may be formed directly to the base layer structure of the resonator element. FIG. 8 shows an exemplary cross section of a resonator element comprising only the base layer. In FIG. 8, frequency-adjustment region 82 have been formed to the base layer structure 81 of the resonator element.

Figure 9:
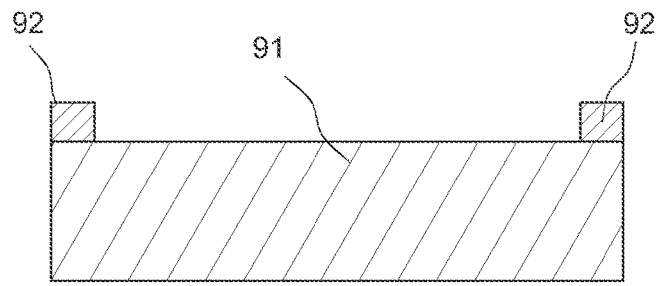
FIG. 9 shows a cross section of an exemplary embodiment of a resonator according to the present disclosure.

The frequency may also be trimmed by growing and patterning a heavy material (such as gold) so that it remains only near the perimeter of the resonator. FIG. 9 shows a cross section of an exemplary embodiment of a resonator according to the present disclosure. In FIG. 9, a base layer structure 91 of a resonator element is patterned with gold 92 at the peripheral regions of the resonator element. If the material removal is done with an ion beam trimmer, the selectivity of the heavy material at the resonator perimeter can be much larger than that of other materials, and thus the TCF of the resonator is not so much affected, and the desired effect of frequency change is reached. The benefit of this approach is that the "effective patterning" of the trimming step is achieved by patterning the top layer (gold) at an earlier process step before the trimming itself. This may be done with standard lithography. This approach enables avoiding complications that can be related to patterning of released devices.

Further, complementary to material removal, controlled addition of material may also be used for realizing the trimming according to the present disclosure. For example, a patterned passivation mask layer offers the possibility of selective material addition. A molybdenum electrode, for example, patterned with a frequency-adjusting trim mask layer leaves metal exposed at the components edges. Exposure to mild oxidation or nitridation conditions will grow layers at those exposed areas, increasing the mass-loading.

In above examples, the edges between the at least two regions are sharp and distinct. This is not required, the edges can be smooth, and the resulting cross-section profile may be continuous.

Further, in most of the above examples, the top layer material has been assumed to be molybdenum, which is softer than Si (or Si/AlN compound). However, the top material does not have to be softer, it can also be harder.

For an electrostatically coupled (Si only) resonator, it may be beneficial to grow a second layer of (weakly doped) polysilicon on top of a base layer structure of a resonator element to obtain TCF tunability (polysilicon can be weakly doped), and thus its TCF can be near −30 ppm/° C. The base layer structure may be in the form of a first layer made of heavily doped silicon and its TCF may be +5 to +20 ppm/° C., for example. The first layer and the second layer of a resonator element according to present disclosure may also form a monolithic structure. The first layer and the second layer may be in the form of distinguishable, differently doped single-crystal layers that have opposite-signed linear TCF values.

The method according to the present disclosure enables extensive adjustments of the frequency and linear TCF of a micromechanical resonator. For example, it is possible to correct a deviation of the resonator frequency in the range of +/−3000 ppm, for example, and/or a deviation of the linear TCF on the order of +/−0.5 ppm. With a method according to the present disclosure, it is possible to form a wafer comprising a plurality of micromechanical resonators (or resonator elements for the micromechanical resonators), for example. The micromechanical resonators may comprise at least one micromechanical resonator according to the present disclosure. At least one thickness of the regions in at least one resonator element of the micromechanical resonators may differ from a thickness of a corresponding region in another micromechanical resonator so that the thicknesses of the regions are such that they produce essentially the same frequency and/or essentially the same linear TCF. The resulting frequencies of the micromechanical resonators are within +/−100 ppm range and/or linear TCFs of the micromechanical resonators may be within 0.1 ppm/° C., for example.

Figure 10:
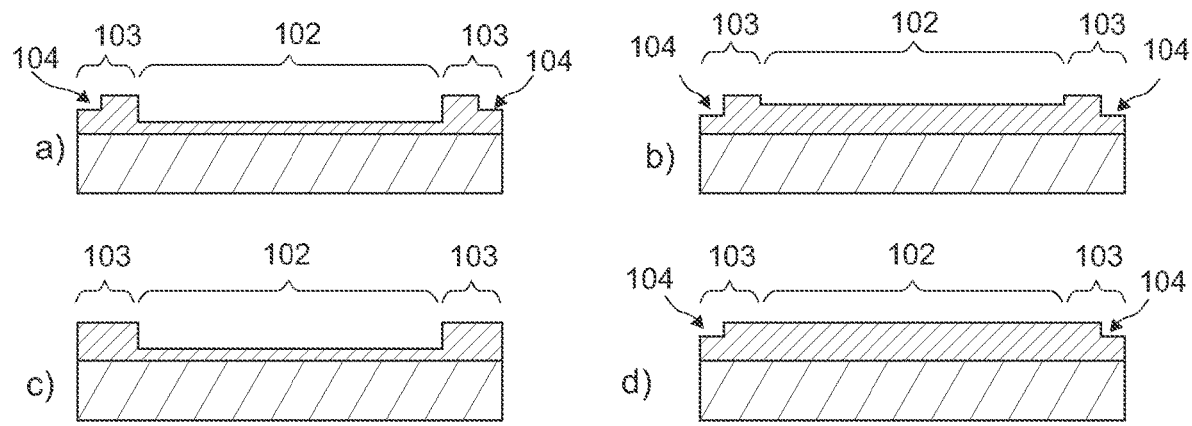
FIGS. 10a to 10d shows a plurality of exemplary cross sections of resonator elements according to the present disclosure.
Figure 11:
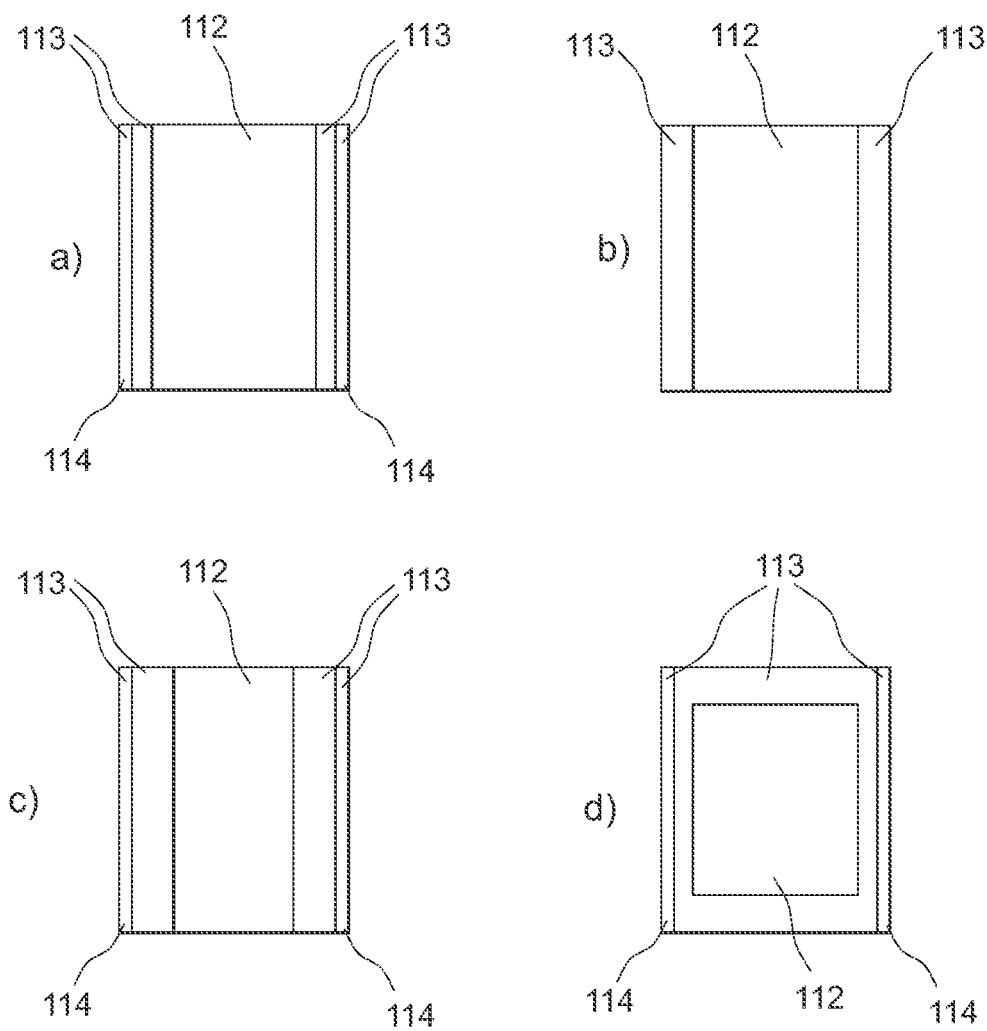
FIGS. 11a to 11d shows a plurality of exemplary top views of resonator elements according to the present disclosure.

When deviations caused by the manufacturing non-idealities are corrected by using one or more aspects of the method according to the present disclosure, the resulting resonators (or resonator elements) may have different dimensions of their patterned regions. FIGS. 10a to 10d shows a plurality of exemplary cross sections of resonator elements according to the present disclosure. FIGS. 10a and 10b show that both the linear TCF and the resonance frequency of the resonator elements have been trimmed. The resonator elements in FIGS. 10a and 10b both have a central region 102 and peripheral regions 103 with different thicknesses. Further, the peripheral regions 103 comprise a smaller frequency-adjusting regions 104 at the outmost periphery of the resonator element. FIG. 10c shows a resonator element having had only its TCF trimmed. The peripheral regions 103 do not show a frequency-adjusting region. FIG. 10d shows a resonator element that has had only its frequency trimmed. The central region 102 and the peripheral regions 103 have the same thickness, and only small frequency-adjusting regions 104 are present in the peripheral regions 103. Although the cross sections are different, the resonator elements may all have the same characteristics because a trimming of TCF and/or frequency according to the present disclosure has been used.

Resonators trimmed with a method according to the present disclosure may have clearly distinguishable appearances when viewed from the top. FIGS. 11a to 11d show exemplary, simplified top views of resonators according to the present disclosure. As shown in FIGS. 11a to 11d, the resonator element of the resonators may comprise peripheral regions 113 of different sizes (e.g. different shape/area/thickness). The peripheral regions 113 may or may not have frequency-adjusting regions 114. If present, the sizes of the frequency-adjusting regions 113 may vary. Further, the sizes (e.g. different shape/area/thickness) of central regions 14 of the resonator elements may also vary.

It will be obvious to a person skilled in the art that the inventive concept can be implemented in various ways. The invention and its embodiments are not limited to the examples described above but may vary within the scope of the claims.

The invention claimed is:

1. A micromechanical resonator comprising a resonator element having a length, a width, and a thickness, the length and the width defining a plane of the resonator element, wherein the resonator element is a compound comprising
  a base layer structure comprising a first layer made of a semiconductor material, and
  a second layer on top of the base layer structure, the second layer forming a topmost layer in the resonator element,
  wherein
  the linear temperature coefficients of the first layer and the second layer have opposite signs, and
  the second layer comprises at least two regions in the plane of the resonator element, the at least two regions of the second layer having different thicknesses.

2. A resonator according to claim 1, wherein the second layer is made of molybdenum or wherein the second layer is in the form of polysilicon deposited on top of the first layer.

3. A resonator according to claim 1, wherein the resonator element is a monolithic silicon structure, where the first layer and the second layer are in the form of layers with different doping levels within the monolithic silicon structure.

4. A resonator according to claim 1, wherein the at least two regions comprise
  a frequency-adjusting region in a peripheral region of the resonator element in the plane of the resonator.

5. A resonator according to claim 4, wherein a surface area of the frequency-adjusting region is 20% or less of the total surface area of a cross section of the resonator in the plane of the resonator.

6. A wafer comprising a plurality of micromechanical resonators, wherein the resonators comprise at least one micromechanical resonator according to claim 1, and wherein at least one thickness of the regions in at least one resonator element of the resonators differs from a thickness of a corresponding region in another resonator so that the thicknesses of the regions are such that they produce essentially the same frequency and/or essentially the same linear temperature coefficients.

7. A wafer according to claim 6, wherein the variation of the frequencies of the resonators are within a range of −100 ppm to +100 ppm and/or the variation of the linear temperature coefficients of frequency (TCF) of the resonators are within 0.1 ppm/° C. of a desired value.

8. A method for trimming a micromechanical resonator comprising a resonator element having a length, a width, and a thickness, the length and the width defining a plane of the resonator, the resonator element being a compound comprising a base layer structure comprising a first layer made of a semiconductor material and a second layer on top of the base layer structure, the second layer forming a topmost layer in the resonator element, wherein the linear temperature coefficients of the first layer and the second layer have opposite signs, wherein the method comprises forming at least two regions in the second layer in the plane of the resonator, wherein the at least two regions have different thicknesses, wherein the thicknesses are selected in response to a deviation of a resonator frequency with respect to a target value and/or a deviation of a linear temperature coefficient of the resonator frequency with respect to a target value.

9. A method according to claim 8, wherein the forming of the at least two regions in the second layer comprises changing a thickness of at least one portion of the second layer in order to form the at least two regions, wherein a difference between the thicknesses of the at least two regions are adjusted in response to a deviation of a linear temperature coefficient of the resonator element from a desired value.

10. A method according to claim 9, wherein shapes and positions of the at least two regions are selected such that an effect of the difference between the thickness of the at least two regions on the resonator frequency is minimized.

11. A method according to claim 9, wherein the method comprises adding at least a second layer of material on top of a surface of a first, base layer of the resonator element, and removing matter from the second layer in order to form the at least two regions of the resonator element.

12. A method according to claim 11, wherein the removing of matter is performed by using laser ablation or ion beam trimming.

13. A method according to claim 8, wherein the forming of the at least two regions comprises forming a frequency-adjusting region in a peripheral region of the resonator element in the plane of the resonator, wherein a surface area of the frequency-adjusting region is selected such that said surface area is sufficiently large for reaching any deviation of the resonator frequency within a set deviation range by adjusting a thickness of the frequency-adjusting region, and adjusting the thickness of the frequency-adjusting region in response to the deviation of the resonator frequency.

* * * * *